United States Patent
Nakamura et al.

(10) Patent No.: US 6,853,269 B2
(45) Date of Patent: Feb. 8, 2005

(54) SURFACE ACOUSTIC WAVE FILTER AND COMMUNICATION DEVICE USING THE FILTER

(75) Inventors: Hiroyuki Nakamura, Katano (JP); Kazunori Nishimura, Yawata (JP); Akio Tsunekawa, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/700,176

(22) Filed: Nov. 3, 2003

(65) Prior Publication Data

US 2004/0095207 A1 May 20, 2004

Related U.S. Application Data

(62) Division of application No. 10/196,433, filed on Jul. 15, 2002, now Pat. No. 6,674,345.

(30) Foreign Application Priority Data

Jul. 13, 2001 (JP) ....................................... 2001-214316

(51) Int. Cl.⁷ ................................................. H03H 9/64
(52) U.S. Cl. .................... 333/193; 333/195; 310/313 B
(58) Field of Search ............................... 333/193–196, 333/133; 310/313 R, 313 B, 313 C, 313 D

(56) References Cited

U.S. PATENT DOCUMENTS

| | | | |
|---|---|---|---|
| 3,688,223 A | 8/1972 | Pratt et al. ................... 333/194 |
| 3,839,687 A | 10/1974 | Subramanian ............... 333/194 |
| 5,874,868 A | 2/1999 | Shimoe ....................... 333/193 |
| 6,160,339 A | 12/2000 | Takagi et al. ............ 310/313 D |
| 6,420,946 B1 | 7/2002 | Bauer et al. ................. 333/193 |
| 6,504,454 B2 | 1/2003 | Takahashi .................... 333/195 |
| 6,583,691 B2 * | 6/2003 | Takamine .................... 333/195 |
| 6,621,380 B2 * | 9/2003 | Takamine .................... 333/195 |
| 6,674,345 B2 * | 1/2004 | Nakamura et al. .......... 333/193 |
| 6,762,657 B2 * | 7/2004 | Takamine .................... 333/193 |
| 6,781,478 B2 * | 8/2004 | Takamine et al. ........... 333/133 |

FOREIGN PATENT DOCUMENTS

| | | |
|---|---|---|
| EP | 0998039 A1 | 5/2000 |
| GB | 2120891 A | 12/1983 |
| JP | 05-121992 | 5/1993 |
| JP | 8-8690 A | 1/1996 |
| JP | 2000-49558 | 2/2000 |
| JP | 2001-144574 A | 5/2001 |
| JP | 2001-217680 | 8/2001 |
| JP | 2002-009487 | 1/2002 |

OTHER PUBLICATIONS

European Search Report for Application No. EP 02 01 5561 dated Sep. 25, 2002.

* cited by examiner

Primary Examiner—Barbara Summons
(74) Attorney, Agent, or Firm—RatnerPrestia

(57) ABSTRACT

A surface acoustic wave filter has a piezoelectric substrate; at least an input IDT electrode arranged on the piezoelectric substrate; and at least an output IDT electrode arranged on the plezoelectric substrate. A pitch of electrode fingers of the input IDT electrode and a pitch of electrode fingers of the output IDT electrode are different from each other.

5 Claims, 13 Drawing Sheets ial application of U.S. application Ser. No. 10/196,433, filed Jul. 15, 2002, now U.S. Pat. No. 6,674,345.

SURFACE ACOUSTIC WAVE FILTER AND COMMUNICATION DEVICE USING THE FILTER

This application is a divisional application of U.S. application Ser. No. 10/196,433, filed Jul. 15, 2002, now U.S. Pat. No. 6,674,345.

BACKGROUND OF THE INVENTION

1. Field of the Invention

The present invention relates to a longitudinal-mode surface acoustic wave filter, a method of manufacturing a surface acoustic wave filter, and a communication device.

2. Related Art of the Invention

In recent years, surface acoustic wave filters have been widely used in mobile communication devices. Surface acoustic wave filters of a longitudinal mode type or a ladder type are used as a filter in a radio frequency (RF) stage. With the improvement in performance of communication devices such as portable telephones, there has been an increasing demand for reducing the loss and increasing the attenuation in surface acoustic wave filters.

A conventional longitudinal-mode surface acoustic wave filter will be described.

FIG. 12 shows a configuration of a conventional longitudinal-mode surface acoustic wave filter. As shown in FIG. 12, the surface acoustic wave filter has a piezoelectric substrate 801, first, second, and third interdigital transducer (IDT) electrodes 802, 803, and 804, and first and second reflector electrodes 805 and 806, the IDT electrodes and the reflector electrodes being formed on the substrate. The upper electrode fingers of each of the second and third IDT electrodes 803 and 804 is connected to an input terminal IN, while the lower electrode fingers of each of the second and third IDT electrodes 803 and 804 is grounded. The lower electrode fingers of the first IDT electrode 802 is connected to an output terminal OUT, while the upper electrode fingers of the first IDT electrode 802 is grounded. The distances between centers of adjacent pairs of the electrode fingers of the first, second, and third IDT electrodes 802, 803, and 804, represented by the distance indicated by P in FIG. 12 (hereinafter referred to as "pitch"), are equal to each other. The longitudinal-mode surface acoustic wave filter is thus constructed.

In the above-described surface acoustic wave filter, the electrode fingers are arranged with a constant pitch in order that the acoustic velocity of a surface acoustic wave be constant through the arrangement of the first, second, and third IDT electrodes 802, 803, and 804. In many instances, however, the number of electrode fingers of the first IDT electrode 802 and that of each of the second and third IDT electrodes 803 and 804 are set different from each other according to a design considering the bandwidth and impedance. Ordinarily, the surface acoustic wave filter is designed so that the number of electrode fingers of the first IDT electrode 802 is larger than that of each of the second and third IDT electrodes 803 and 804.

A longitudinal-mode surface acoustic wave filter has also been used which is designed so that the electrode fingers of each of electrodes have different pitches as shown in FIG. 13 to achieve a reduction in loss for example. The conventional longitudinal-mode surface acoustic wave filter shown in FIG. 13 is based on a design in which each IDT electrodes have an electrode finger pitch different from that in a main region.

Referring to FIG. 13, the surface acoustic wave filter has a piezoelectric substrate 1201, first, second, and third IDT electrodes 1202, 1203, and 1204, and first and second reflector electrodes 1205 and 1206, the IDT electrodes and the reflector electrodes being formed on the substrate. The upper electrode fingers of each of the second and third IDT electrodes 1203 and 1204 is connected to an input terminal IN, while the lower one of each of the second and third IDT electrodes 1203 and 1204 is grounded. The lower electrode fingers of the first IDT electrode 1202 is connected to an output terminal OUT, while the upper electrode fingers of the first IDT electrode 1202 is grounded.

Also, referring to FIG. 13, if the pitch in a region indicated by 1a in the first IDT electrode 1202 is P, P is ½ wavelength. If the pitch in a region indicated by 1b is P', P' is smaller than ½ wavelength. The pitch in a region indicated by 2a in the second IDT electrode 1203 is P, and P is ½ wavelength. The pitch in a region indicated by 2b is P', and P' is smaller than ½ wavelength. Similarly, the pitch in a region indicated by 3a in the third IDT electrode 1204 is P, and P is ½ wavelength. The pitch in a region indicated by 3b is P', and P' is smaller than ½ wavelength.

Thus, in each of the first IDT electrode 1202, the second IDT electrode 1203, and the third IDT electrode 1204, different electrode finger pitches are set between the electrode fingers in the same IDT electrodes.

Also in many instances relating to the arrangement shown in FIG. 13, the number of electrode fingers of the first IDT electrodes 1202 and that of each of the second and third IDT electrodes 1203 and 1204 are set different from each other according to a design considering the bandwidth and impedance. Ordinarily, the surface acoustic wave filter is designed so that the number of electrode fingers of the first IDT electrode 1202 is larger than that of each of the second and third IDT electrodes 1203 and 1204.

There is a problem in such a surface acoustic wave filter that there is a limit to improvement in filter characteristics in achieving a wide-band characteristic.

SUMMARY OF THE INVENTION

In view of the above-described problem, an object of the present invention is to provide a wide-band surface acoustic wave filter having a steep out-of-band attenuation characteristic, a method of manufacturing the surface acoustic wave filter, and a communication device.

One aspect of the present invention is a surface acoustic wave filter comprising:

a piezoelectric substrate;

at last an input IDT electrode arranged on said piezoelectric substrate; and at least an output IDT electrode arranged on said piezoelectric substrate, wherein a pitch of electrode fingers of said input IDT electrode and a pitch of electrode fingers of said output IDT electrode are different from each other.

Another aspect of the present invention is the surface acoustic wave filter, wherein the pitch of electrode fingers of the IDT electrode larger in number of electrode fingers in said input and output IDT electrode is larger than the pitch of electrode fingers smaller in number of electrode fingers.

Still another aspect of the present invention is a surface acoustic wave filter comprising:

a piezoelectric substrate;

at least an input IDT electrode arranged on said piezoelectric substrate; and at least an output IDT electrode arranged on said piezoelectric substrate, wherein the metalization ratio of said input IDT electrodes and the metalization ratio of said output IDT electrodes are different from each other.

Yet still another aspect of the present invention is the surface acoustic wave filter, wherein the metalization ratio of an IDT electrode larger in number of electrode fingers in said input and output IDT electrodes is lower than the metalization ratio of an IDT electrode smaller in number of electrode fingers.

Still yet another aspect of the present invention is the surface acoustic wave filter, wherein if an IDT electrode has a plurality of electrode finger pitches, the pitch of main excitation electrode fingers is set as a basic pitch.

A further aspect of the present invention is the surface acoustic wave filter, wherein a peak frequency of a radiation characteristic of said input IDT electrode is substantially equal to a peak frequency of a radiation characteristic of said output IDT electrode.

A still further aspect of the present invention is the surface acoustic wave filter, wherein one of said input IDT electrode and said output IDT electrode comprises a first IDT electrode including a pair of electrode fingers opposed to each other;

the other of said input IDT electrode and said output IDT electrode comprises a second IDT electrode including a pair of electrode fingers opposed to each other, and a third IDT electrode including a pair of electrode fingers opposed to each other, said second IDT electrode being placed on one side of said first IDT electrode, said third IDT electrode being placed on the other side of said first IDT electrode;

said first, second, and third IDT electrodes are arranged along a direction in which a surface acoustic wave propagates; and the peak frequency of the radiation characteristic of said first IDT electrode is substantially equal to the peak frequency of the radiation characteristic of each of the second and third IDT electrodes.

A yet further aspect of the present invention is the surface acoustic wave filter, wherein one of said input IDT electrode and said output IDT electrode comprises first, fourth, and fifth IDT electrodes each including a pair of electrode fingers opposed to each other;

the other of said input IDT electrode and said output IDT electrodes comprises a second and third IDT electrodes each including a pair of electrode fingers opposed to each other;

said second and third IDT electrodes are placed on opposite sides of said first IDT electrode;

said fourth IDT electrode are placed on the side of said second IDT electrodes opposite from the side on which said first IDT electrode are placed;

said fifth IDT electrode are placed on the side of said third IDT electrode opposite from the side on which said first IDT electrode are placed;

said first, second, third, forth and fifth IDT electrodes are arranged along a direction in which a surface acoustic wave propagates; and the peak frequencies of the radiation characteristics of at least more than one of the group of said first IDT electrode, and the group of said fourth and fifth IDT electrodes, and the group of said second and third IDT electrodes are substantially equal to each other.

A still yet further aspect of the present invention is the surface acoustic wave filter, wherein the film thickness of said first IDT electrode and the film thickness of each of said second and third IDT electrodes are different from each other.

An additional aspect of the present invention is the surface acoustic wave filter, wherein the material of said first IDT electrode and the material of each of said second and third IDT electrodes are different from each other.

A still additional aspect of the present invention is the surface acoustic wave filter, wherein the metalization ratio of said first IDT electrode and the metalization ratio of each of said second and third IDT electrodes are equal to each other;

the number of electrode fingers of said first IDT electrode is larger than the number of electrode fingers of each of said second and third IDT electrodes; and the electrode finger pitch of said first IDT electrode is larger than the electrode finger pitch of each of said second and third IDT electrodes.

A yet additional aspect of the present invention is the surface acoustic wave filter, wherein the metalization ratio of said first IDT electrode, the metalization ratio of said second IDT electrode and the metalization ratio of said third IDT electrode are different from each other.

A still yet additional aspect of the present invention is the surface acoustic wave filter, wherein a plurality of filter tracks each having first, second, and third IDT electrodes, and first and second reflector electrodes are formed on said piezoelectric substrate, and said plurality of filter tracks function as one filter in cooperation with each other.

A supplementary aspect of the present invention is the surface acoustic wave filter, wherein each of said plurality of filter tracks is identical in configuration to the others.

A still supplementary aspect of the present invention is the surface acoustic wave filter, wherein at least one of said plurality of filter tracks is different in configuration from the others.

A yet supplementary aspect of the present invention is the surface acoustic wave filter, further comprising a first reflector electrode placed on the opposite side of said second IDT electrode on said piezoelectric substrate opposite from the side on which said first IDT electrode are placed; and a second reflector electrode placed on the side of said third IDT electrode on said piezoelectric substrate opposite from the side on which said first IDT electrode are placed, wherein said first, second, and third IDT electrodes and said first and second reflector electrodes are arranged along a direction in which a surface acoustic wave propagates.

A still yet supplementary aspect of the present invention is a method of manufacturing a surface acoustic wave filter, comprising a piezoelectric substrate;

an input IDT electrode arranged on the piezoelectric substrate; and an output IDT electrode arranged on the piezoelectric substrate, wherein said method makes a pitch of electrode fingers of said input IDT electrode and a pitch of electrode fingers of said output IDT electrode different values.

Another aspect of the present invention is a communication device comprising:

a transmitting circuit which outputs a transmitted wave; and a receiving circuit to which a wave to be received is input, wherein a surface acoustic wave filter is used in said transmitting circuit and/or in said receiving circuit.

Still another aspect of the present invention is a communication device comprising:

a transmitting circuit which outputs a transmitted wave; and a receiving circuit to which a wave to be received is input, wherein the surface acoustic wave filter is used in said transmitting circuit and/or in said receiving circuit.

Figure 1:
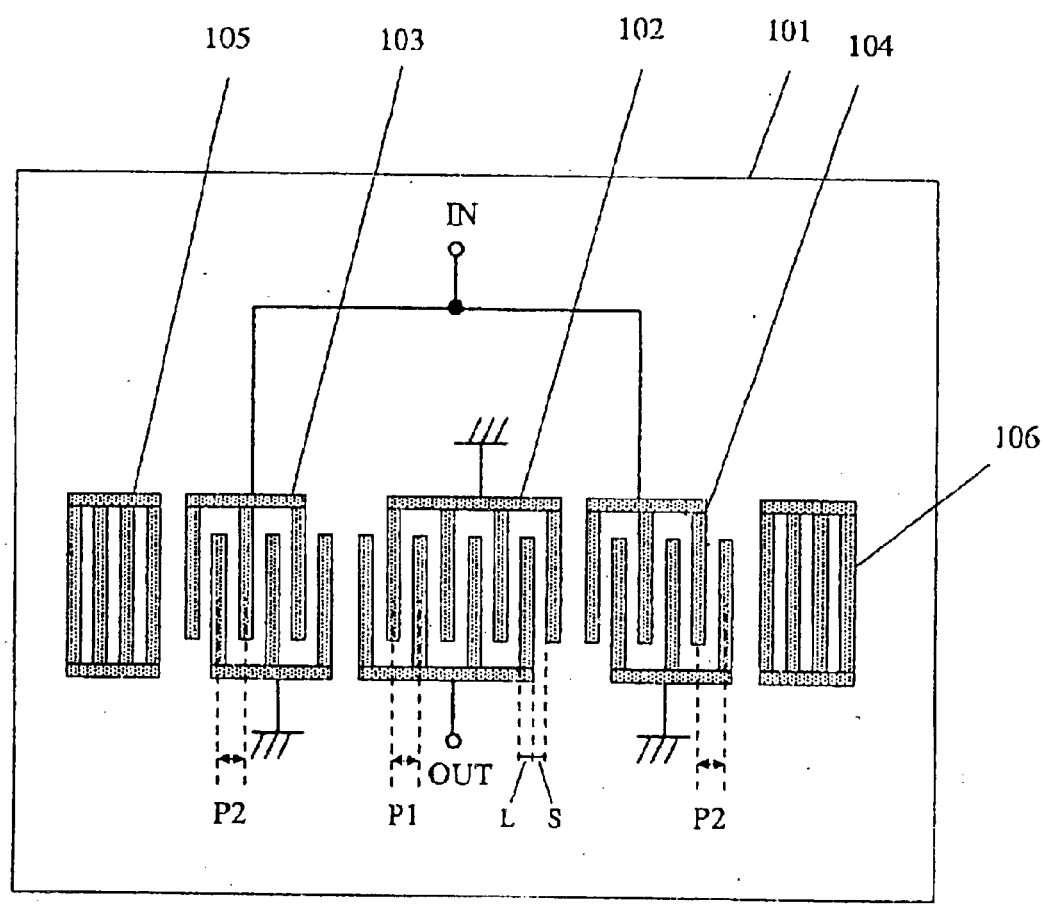
FIG. 1 is a diagram of a configuration of a surface acoustic wave filter in a first embodiment of the present invention.

DESCRIPTION OF SYMBOLS 101 piezoelectric substrate
102 first IDT electrodes
103 second IDT electrodes
104 third IDT electrodes
105 reflector electrode
106 reflector electrode
301 piezoelectric substrate
302 first IDT electrodes
303 second IDT electrodes
304 third IDT electrodes
305 reflector electrode
306 reflector electrode
307 filter track
308 fourth IDT electrodes
309 fifth IDT electrodes
310 sixth IDT electrodes
311 reflector electrode
312 reflector electrode
313 filter track
601 piezoelectric substrate
602 first IDT electrodes
603 second IDT electrodes
604 third IDT electrodes
605 reflector electrode
606 reflector electrode
701 piezoelectric substrate
702 first IDT electrodes
703 second IDT electrodes
704 third IDT electrodes
705 reflector electrode
706 reflector electrode
707 filter track
708 fourth IDT electrodes
709 fifth IDT electrodes
710 sixth IDT electrodes
711 reflector electrode
712 reflector electrode
713 filter track

PREFERRED EMBODIMENTS OF THE INVENTION

Embodiments of the present invention will be described with reference to the drawings.

First Embodiment

A first embodiment of the present invention will be described. FIG. 1 schematically shows a surface acoustic wave filter which represents a first embodiment of the present invention.

Referring to FIG. 1, the surface acoustic wave filter has a piezoelectric substrate 101, first, second, and third IDT electrodes 102, 103, and 104, and first and second reflector electrodes 105 and 106, the IDT electrodes and the reflector electrodes being formed on the substrate.

The second IDT electrode 103 and the third IDT electrode 104 are placed on the opposite sides of the first IDT electrode 102. The reflector electrode 105 is placed on the side of the second IDT electrode 103 opposite from the side on which the first IDT electrode 102 are placed. The reflector electrode 106 is placed on the side of the third IDT electrode 104 opposite from the side on which the first IDT electrode 102 are placed. Thus, the first, second, and third IDT electrode 102, 103, and 104 and the first and second reflector electrodes 105 and 106 are arranged along the direction of propagation of a surface acoustic wave.

The upper electrode fingers of each of the second and third IDT electrodes 103 and 104 is connected to an input terminal IN, while the lower electrode fingers of each of the second and third IDT electrodes 103 and 104 is grounded. The lower electrode fingers of the first IDT electrode 102 is connected to an output terminal OUT, while the upper electrode fingers of the first IDT electrode 102 is grounded.

The number of electrode fingers of the first IDT electrode 102 is larger than that of each of the second and third IDT electrodes 103 and 104, and the number of electrode fingers of the second IDT electrode 103 and that of the third IDT electrode 104 are equal to each other.

If the pitch of the first IDT electrode 102 is represented by P1 and the pitch of the second and third IDT electrode 103 and 104 is represented by P2, the relationship between P1 and P2 is P1>P2.

The first IDT electrode 102 and each of the second and third IDT electrode 103 and 104 have metalization ratios η equal to each other. The metalization ratio η represents the proportion of the width of the electrode finger in one wavelength.

The metalization ratio η is expressed by the following equation (1).

$$\eta = L/(L+S) \qquad \text{[Equation 1]}$$

where L is the width of one electrode finger and S is the spacing from this electrode finger to the next electrode finger.

The operation of this embodiment will now be described.

Figure 2:
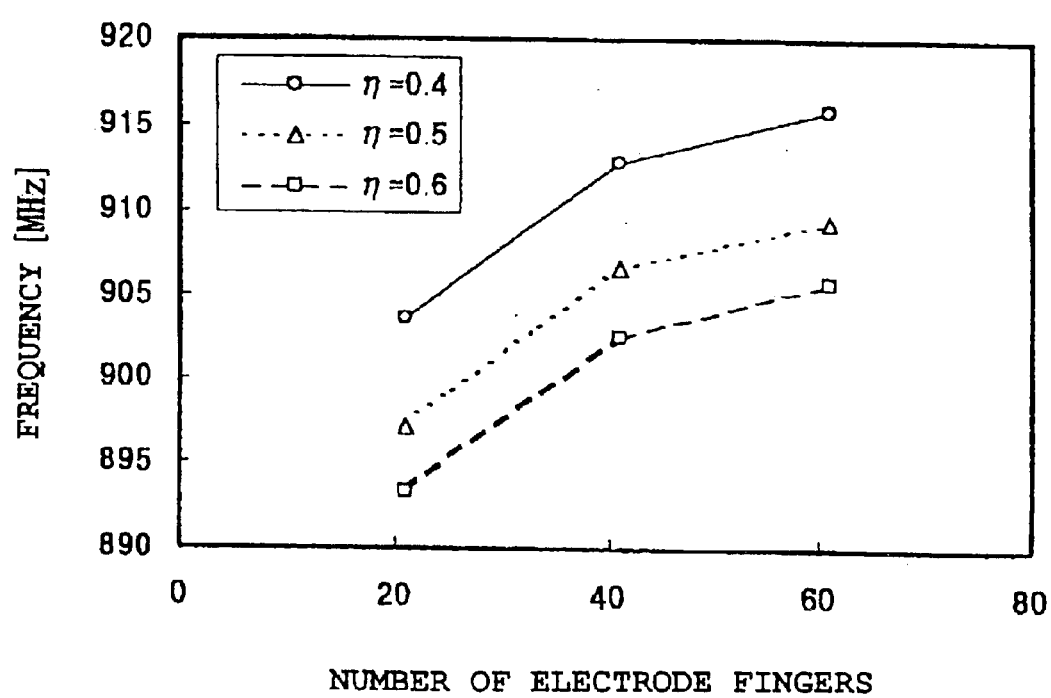
FIG. 2 is a diagram showing a relationship between (peak frequencies) of radiation characteristics and the number of electrode fingers.

FIG. 2 shows the relationship between the number and the metalization ratio η of electrode fingers of the first IDT electrode 102 and peak frequencies of radiation characteristics of the first IDT electrode 102. A peak frequency of a radiation characteristic is defined as a frequency at which level of the radiation is peaked. That is, the radiation characteristic of the first IDT electrode 102 is measured with respect to particular values of the number and the metalization ratio η of electrode fingers of the first IDT electrode 102 when the pitch is fixed to obtain the peak frequency of the radiation characteristic, and the characteristics curves shown in FIG. 2 are formed by plotting the center frequencies obtained.

As described above, while the number of electrode fingers and the metalization ratio η of the first IDT electrode 102 are changed in the process of obtaining the relationship shown in FIG. 2, the electrode finger pitch is fixed.

As is apparent from FIG. 2, when the number of electrode fingers of the first IDT electrode 102 is more increased, the peak frequency of the radiation characteristic of the first IDT electrode 102 is higher. Also, if the metalization ratio η of the first IDT electrode 102 is increased, the center frequency of the radiation characteristic of the first IDT electrode 102 is lower. Thus, the peak frequency of the radiation characteristic of the first IDT electrode 102 becomes higher when the number of electrode fingers is more increased or when the metalization ratio η is more reduced while the electrode film thickness of the first IDT electrode 102 is constant. With respect to the second and third IDT electrodes 103 and 104, the same tendency as that observed with respect to the first IDT electrode 102 is recognized.

Figure 4:
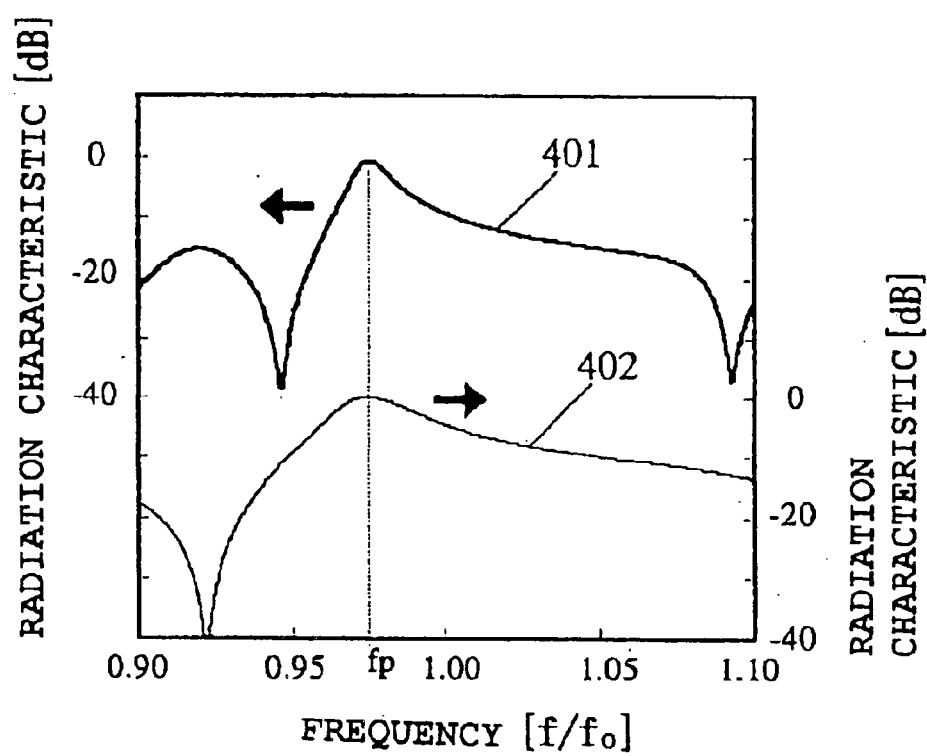
FIG. 4 is a graph of radiation characteristics of IDT electrodes in the first and third embodiments of the present invention.
Figure 5:
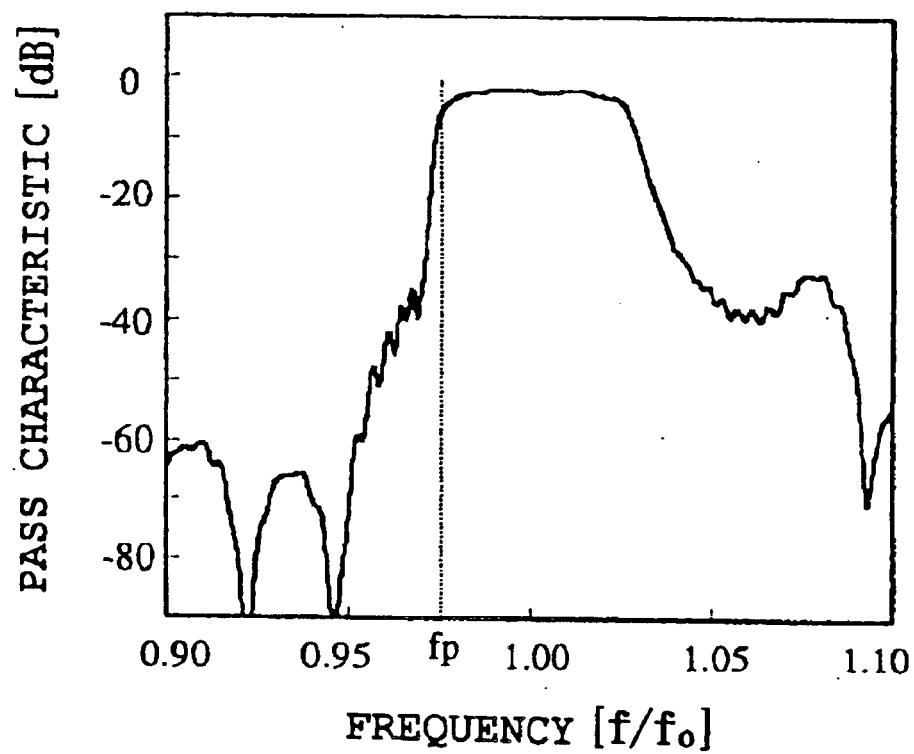
FIG. 5 is a graph of a path characteristic of the surface acoustic wave filter in the first and third embodiments of the present invention.

In FIG. 4, the radiation characteristic of the first IDT electrode 102 is indicated by 401. As clearly shown in FIG. 4, the radiation characteristic of the first IDT electrode 102 is asymmetric about the center frequency because of the influence of a reflection characteristic.

The radiation characteristic of the second IDT electrode 103 is indicated by 402 in FIG. 4. The radiation characteristic of the second IDT electrode 103 is asymmetric about the center frequency because of the influence of a reflection characteristic, as is that of the first IDT electrode 102. Since the third IDT electrode 104 has the same number of electrode fingers as the second IDT electrode 103, the radiation characteristic of the third IDT electrode 104 is the same as that of the second IDT electrode 103. Therefore the radiation characteristic of the third IDT electrode 104, as well as that of the second IDT electrode 103, is indicated by 402 in FIG. 4.

On the other hand, the inventor of the present invention found the fact that the surface acoustic wave filter has an improved characteristic if it is designed so that the center frequency of the radiation characteristic 401 of the first IDT electrode 102 and the center frequency of the radiation characteristic 402 of the second and third IDT electrodes 103 and 104 are equal to each other, i.e., the fact that if the surface acoustic wave filter is designed in this manner, it has an attenuation characteristic of a wider band.

As mentioned above, the number of electrode fingers of the first IDT electrode 102 is larger than that of each of the second and third IDT electrodes 103 and 104. Therefore, as is apparent from FIG. 2, if the pitch of the electrode fingers of the first IDT electrode 102 is equal to that of the electrode fingers of each of the second and third IDT electrodes 103 and 104, the center frequency of the radiation characteristic of the first IDT electrode 102 is higher than that of the radiation characteristic of the second and third IDT electrodes 103 and 104.

However, as is apparent from FIG. 2, the center frequency of the radiation characteristic of the first IDT electrode 102 and that of the radiation characteristic of the second and third IDT electrodes 103 and 104 can be set approximately equal to each other by establishing the relationship P1>P2. More specifically, while there is a difference of about 0.9% between the center frequencies of the radiation characteristics when P1=P2, the difference between the center frequencies of the radiation characteristics can be reduced to about 0.5% and, preferably, to 0.1% by establishing the relationship P1>P2. That is, the pitch of the group of electrode fingers larger in number in the groups of electrode fingers of the IDT electrodes constituting the surface acoustic wave filter shown in FIG. 1 may be adjusted so as to be larger than the pitch of the other groups of electrode fingers smaller in number to set the radiation characteristics of the IDT electrodes in correspondence with each other.

The surface acoustic wave filter is thus arranged to be realized as a wide-band filter having a steep attenuation characteristic.

While this embodiment has been described by assuming that the input terminal IN is of an unbalanced type, the input terminal IN is not limited to the unbalanced type. A balanced type of input terminal IN may alternatively be used.

While this embodiment has been described by assuming that the output terminal OUT is an unbalanced type, the output terminal OUT is not limited to the unbalanced type. A balanced type of output terminal OUT may alternatively be used.

This embodiment has been described with respect to the case where each electrodes in the second and third IDT electrodes 103 and 104 is connected to the input terminal IN while the first IDT electrode 102 is connected to the output terminal OUT. However, the arrangement may alternatively be such that each electrodes in the second and third IDT electrodes 103 and 104 is connected to the output terminal OUT while the first IDT electrode 102 is connected to the input terminal IN.

This embodiment has been described by assuming that the number of fingers of the second and third IDT electrodes are equal to each other. However, if these numbers are different, the IDT electrodes may be adjusted so that their radiation characteristics coincide with each other.

Second Embodiment

A second embodiment of the present invention will be described.

Figure 3:
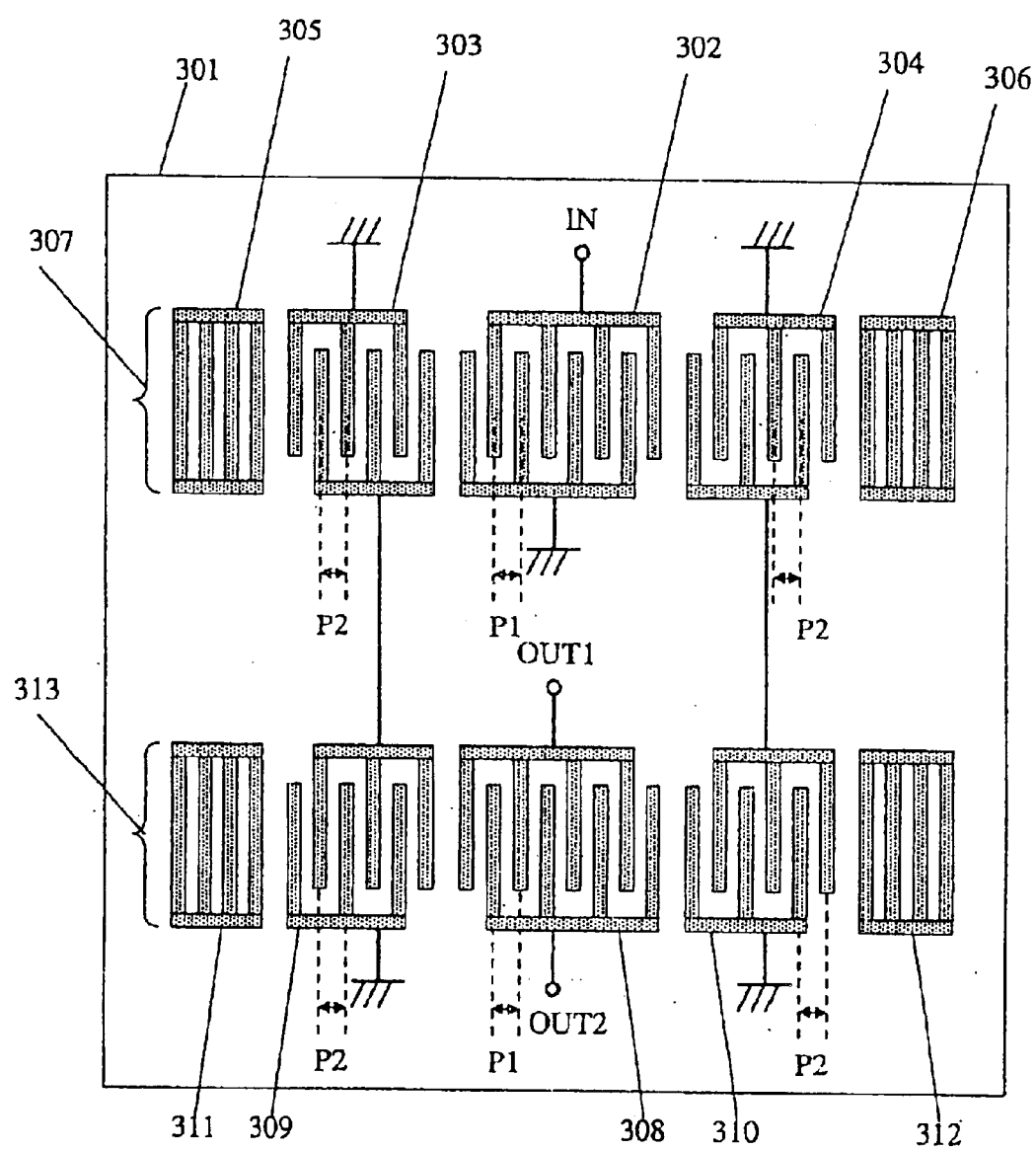
FIG. 3 is a diagram of a configuration of a surface acoustic wave filter in a second embodiment of the present invention.

FIG. 3 schematically shows a surface acoustic wave filter of this embodiment.

Referring to FIG. 3, a first filter track 307 is formed on a piezoelectric substrate 301 by first, second, and third IDT electrodes 302, 303, and 304, and first and second reflector electrodes 305 and 306. That is, the second IDT electrodes 303 and the third IDT electrodes 304 are placed on the both sides of the first IDT electrodes 302. The reflector electrode 305 is placed on the side of the second IDT electrode 303 opposite from the side on which the first IDT electrode 302 are placed. The reflector electrode 306 is placed on the side of the third IDT electrode 304 opposite from the side on which the first IDT electrode 302 are placed.

Also, a second filter track 313 is formed by fourth, fifth, and sixth IDT electrodes 308, 309, and 310, and first and second reflector electrodes 311 and 312. That is, the fifth IDT electrode 309 and the sixth IDT electrode 310 are placed on the opposite sides of the fourth IDT electrode 308. The reflector electrode 311 is placed on the side of the fifth IDT electrode 309 opposite from the side on which the fourth IDT electrode 308 are placed. The reflector electrode 312 is placed on the side of the sixth IDT electrode 310 opposite from the side on which the fourth IDT electrode 308 are placed.

The upper electrode fingers of the first IDT electrode 302 is connected to an input terminal IN. The lower electrode fingers of the second IDT electrode 303 is connected to the upper electrode fingers of the fifth IDT electrode 309, and the lower electrode fingers of the third IDT electrode 304 is connected to the upper electrode fingers of the sixth IDT electrode 310. The upper electrode fingers of the fourth IDT electrode 308 is connected to an output terminal OUT1, while the lower electrode fingers of the fourth IDT electrode 308 is connected to another output terminal OUT2.

The number of electrode fingers of the first IDT electrode 302 is equal to that of the fourth IDT electrode 308. The second IDT electrode 303, the third IDT electrode 304, the fifth IDT electrode 309 and the sixth IDT electrode 310 have numbers of electrode fingers equal to each other.

The number of electrode fingers of each of the first and fourth IDT electrodes 302 and 308 is larger than that of each of the second, third, fifth, and sixth IDT electrodes 303, 304, 309, and 310. The pitch of the electrode fingers of the first and fourth IDT electrodes 302 and 308 is represented by P1 and the pitch of the electrode fingers of the second, third, fifth, and sixth IDT electrodes 303, 304, 309, and 310 is represented by P2. The relationship between P1 and P2 is P1>P2. The metalization ratios of all of IDT electrodes are equal to each other. The surface acoustic wave filter of this embodiment is thus constructed as a two-stage longitudinal-mode surface acoustic wave filter.

The operation of this embodiment will be described.

Figure 8:
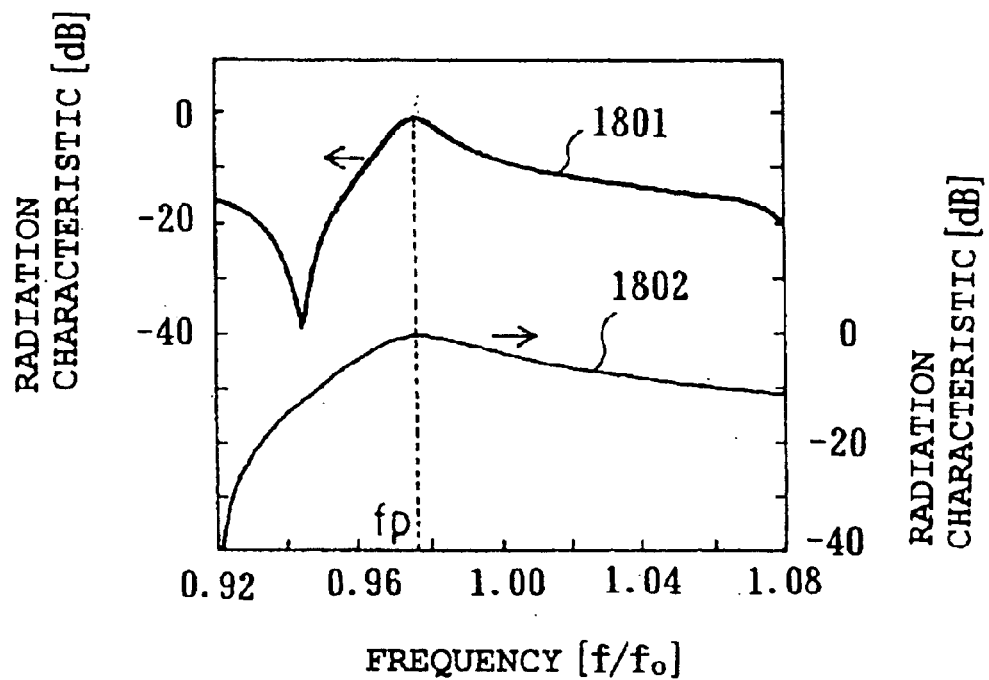
FIG. 8(a) is a graph of radiation characteristics of IDT electrodes in the second embodiment of the present invention.
FIG. 8(b) is a graph of a pass characteristic of the surface acoustic wave filter in the second embodiment of the present invention.
Figure 8:
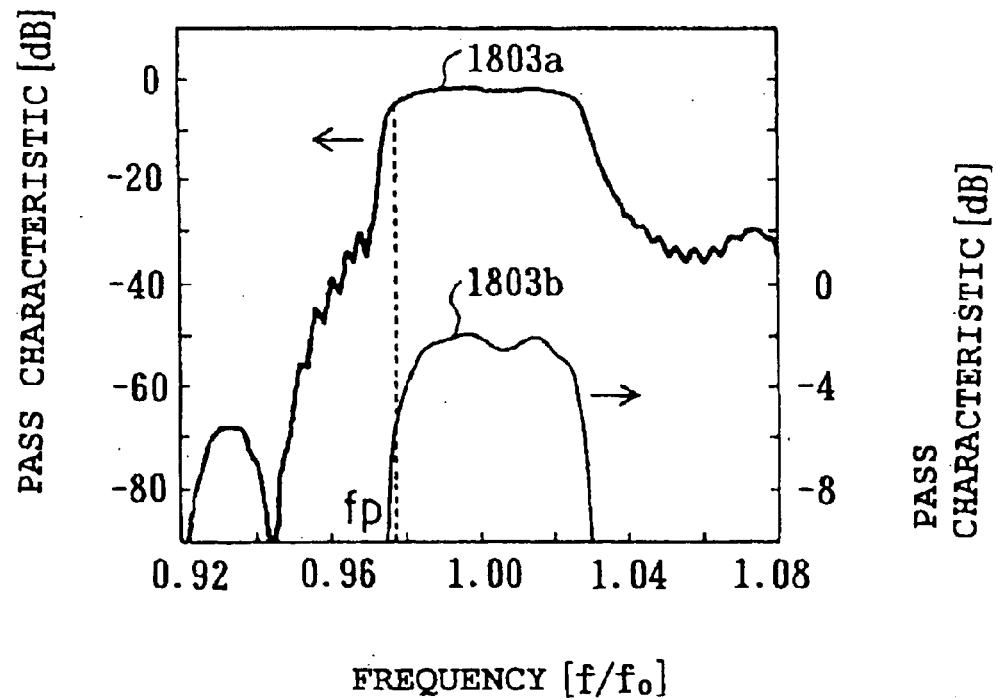

FIG. 8(*a*) shows radiation characteristics of the first and second IDT electrodes 302 and 303. The radiation characteristic of the first IDT electrode 302 is indicated by 1801 and the radiation characteristic of the second IDT electrode 303 is indicated by 1802. As is apparent from FIG. 8, the peak frequency of the radiation characteristic 1801 and the peak frequency of the radiation characteristic 1802 coincide with each other. The peak frequencies fp of the radiation characteristics of the first and second IDT electrodes 302 and 303 can be set approximately equal to each other by establishing the relationship P1>P2, as in the first embodiment. Also, the peak frequency fp of the radiation characteristic of the first IDT electrode 302 can be set approximately equal to the peak frequency fp of the radiation characteristic of the third IDT electrode 304 by establishing the relationship P1>P2. Further, the peak frequency fp of the radiation characteristic of the fourth IDT electrode 308 can be set approximately equal to the peak frequency fp of the radiation characteristic of each of the fifth and sixth IDT electrodes 309 and 310 by establishing the relationship P1>P2.

FIG. 8(*b*) shows a pass characteristic of the surface acoustic wave filter of this embodiment indicated by 1803*a* and by 1803*b*. The pass characteristic of the surface acoustic wave filter of this embodiment is indicated by 1803*a* with respect to a wide gain range from 0 dB to 90 dB, and a central portion of the characteristic curve 1803*a* is indicated by 1803*b* with respect to an arrow gain range from 0 dB to 10 dB. Frequency fp is the peak frequency of the radiation characteristic of each IDT electrodes. This filter pass characteristic of the surface acoustic wave filter is exhibited when the peak frequency fp of the radiation characteristic of each IDT electrodes is set in correspondence with the left end of the pass band, i.e., the lower limit frequency of the pass band.

Figure 9:
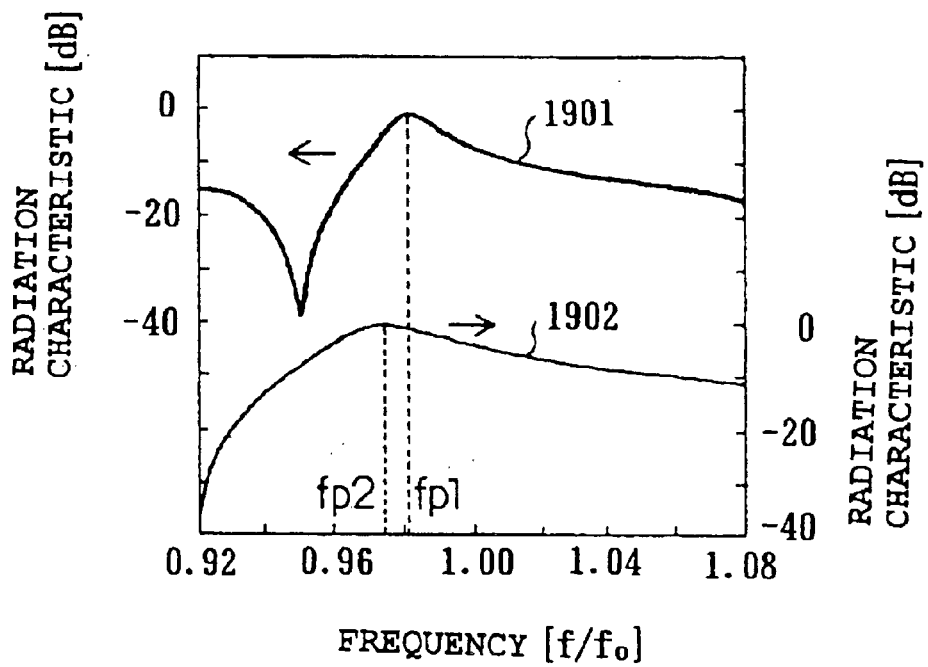
FIG. 9(a) is a graph of radiation characteristics of IDT electrodes in a conventional surface acoustic wave filter in which peak frequencies of radiation characteristic of IDT electrodes do not coincide with each other.
FIG. 9(b) is a graph of a pass characteristic of the surface acoustic wave filter relating to FIG. 9(a).
Figure 9:
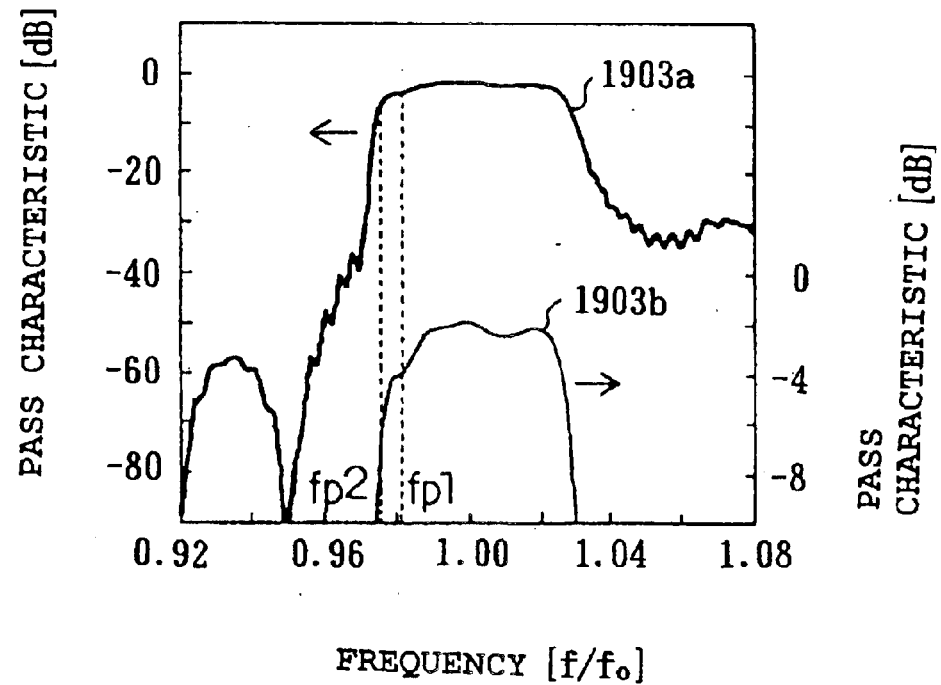

FIG. 9(*a*) shows radiation characteristics of IDT electrodes in a conventional surface acoustic wave filter. In FIG. 9(*a*), the first and fourth IDT electrodes 302 and 308 have the radiation characteristic indicated by 1901, and the second, third, fifth, and sixth IDT electrodes 303, 304, 309, and 310 have the radiation characteristic indicated by 1902. That is, in the conventional surface acoustic wave filter, the center frequency fp1 of the first and fourth IDT electrodes 302 and 308 and the center frequency fp2 of the second, third, fifth, and sixth IDT electrodes 303, 304, 309, and 310 do not coincide with each other.

FIG. 9(*b*) shows a pass characteristic of this surface acoustic wave filter indicated by 1903*a* and by 1903*b*. The pass characteristic of the conventional surface acoustic wave filter is indicated by 1903*a* with respect to a wide gain range from 0 dB to 90 dB, and a central portion of the characteristic curve 1903*a* is indicated by 1903*b* with respect to a narrow gain range from 0 dB to 10 dB.

In the pass characteristic 1803*b* shown in FIG. 8(*b*) an improvement is recognized in comparison with the pass characteristic 1903*b* shown in FIG. 9(*b*), such that a cut of the pass band at the left end is reduced to widen the pass band. This means a reduction in loss at the band end.

Thus, the center frequencies of the radiation characteristics of the IDT electrodes are set approximately equal to each other to realize a surface acoustic wave filter having a characteristic of a wider band.

As described above, according to this embodiment, a wide-band surface acoustic wave filter having a steep attenuation characteristic can be realized.

While the output terminals form a balanced output in this embodiment, the same effect of the present invention can also be achieved even if the upper or lower one of the fourth IDT electrode may be grounded to form an unbalanced output.

Third Embodiment

A third embodiment of the present invention will be described.

Figure 6:
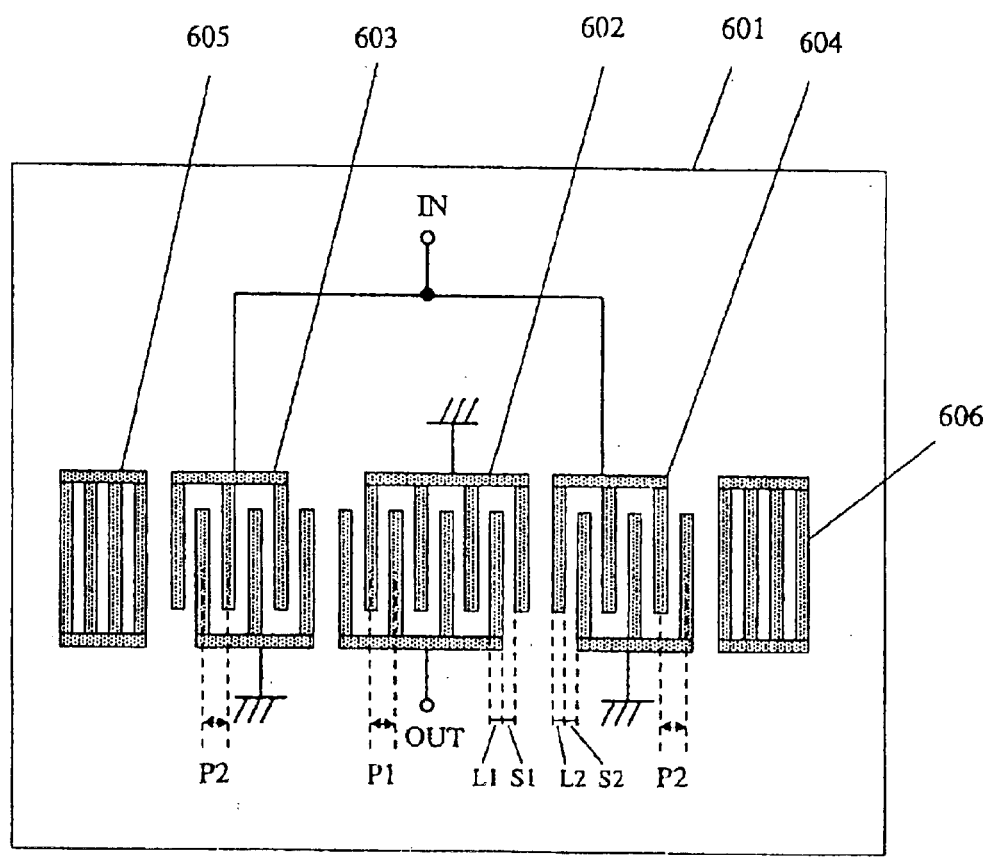
FIG. 6 is a diagram of a configuration of a surface acoustic wave filter in a third embodiment of the present invention.

FIG. 6 schematically shows a surface acoustic wave filter of this embodiment. Referring to FIG. 6, the surface acoustic wave filter has a piezoelectric substrate 601, first, second, and third IDT electrodes 602, 603, and 604, and first and second reflector electrodes 605 and 606, the IDT electrodes and the reflector electrodes being formed on the substrate.

The second IDT electrode 603 and the third IDT electrode 604 are placed on the both sides of the first IDT electrode 602. The reflector electrode 605 is placed on the side of the second IDT electrode 603 opposite from the side on which the first IDT electrode 602 are placed. The reflector electrode 606 is placed on the side of the third IDT electrode 604 opposite from the side on which the first IDT electrode 602 are placed.

The upper electrode fingers of each of the second and third IDT electrodes 603 and 604 is connected to an input terminal IN, while the lower electrode fingers of each of the second and third IDT electrodes 603 and 604 is grounded. The lower electrode of the first IDT electrode 602 is connected to an output terminal OUT, while the upper one of the first IDT electrode 602 is grounded.

The number of electrode fingers of the first IDT electrode 602 is larger than that of each of the second and third IDT electrodes 603 and 604, and the number of electrode fingers of the second IDT electrode 603 and that of the third IDT electrode 604 are equal to each other.

The pitch of the electrode fingers of the first IDT electrode 602 is represented by P1 and the pitch of the electrode fingers of the second and third IDT electrodes 603 and 604 is represented by P2. The relationship between P1 and P2 is P1>P2.

In the surface acoustic wave filter of this embodiment, the first IDT electrode 602 and each of the second and third IDT electrodes 603 and 604 have metalization ratios different from each other.

The operation of this embodiment will be described.

The number of electrode fingers of the first IDT electrode 602 is larger than that of each of the second and third IDT electrodes 603 and 604. Therefore, as is apparent from FIG. 2, if the metalization ratio of the first IDT electrode 602 is equal to that of the second and third IDT electrodes 603 and 604, the center frequency of the radiation characteristic of the first IDT electrode 602 is higher than that of the radiation characteristic of the second and third IDT electrodes 603 and 604.

However, as is apparent from FIG. 2, the peak frequency of the radiation characteristic of the first IDT electrode 602 and that of the radiation characteristic of the second and third IDT electrodes 603 and 604 can be set approximately equal to each other by establishing the relationship P1>P2 and by making the metalization ratio of the first IDT electrode 602 and the metalization ratio of the second and third IDT electrodes 603 and 604 different values.

In this embodiment, as described above, the center frequency of the radiation characteristic of the first IDT electrode 602 and the center frequency of the radiation characteristic of the second and third IDT electrodes 603 and 604 can be set approximately equal to each other by adjusting the pitch and the metalization ratio of each IDT electrodes. Since adjustment of the metalization of each IDT electrode, i.e., adjustment of the intensity of surface acoustic wave excitation and the reflection on each IDT electrodes, is also performed, the design freedom is improved in comparison with the first embodiment.

While in this embodiment the pitches are adjusted so that P1>P2, being not exclusively used adjustment of the metalization ratio may alternatively be performed while the pitches are set in the relationship P1=P2.

The surface acoustic wave filter is thus arranged to be realized as a wide-band filter having a steep attenuation characteristic.

While this embodiment has been described by assuming that the input terminal IN is of an unbalanced type, the input terminal IN is not limited to the unbalanced type. A balanced type of input terminal IN may alternatively be used.

While this embodiment has been described by assuming that the output terminal OUT is an unbalanced type, the output terminal OUT is not limited to the unbalanced type. A balanced type of output terminal OUT may alternatively be used.

This embodiment has been described with respect to the case where the second and third IDT electrodes 603 and 604 is connected to the input terminal IN while the first IDT electrode 602 is connected to the output terminal OUT. However, the arrangement may alternatively be such that the second and third IDT electrodes 603 and 604 is connected to the output terminal OUT while the first IDT electrode 602 is connected to the input terminal IN.

Fourth Embodiment

A fourth embodiment of the present invention will be described.

Figure 7:
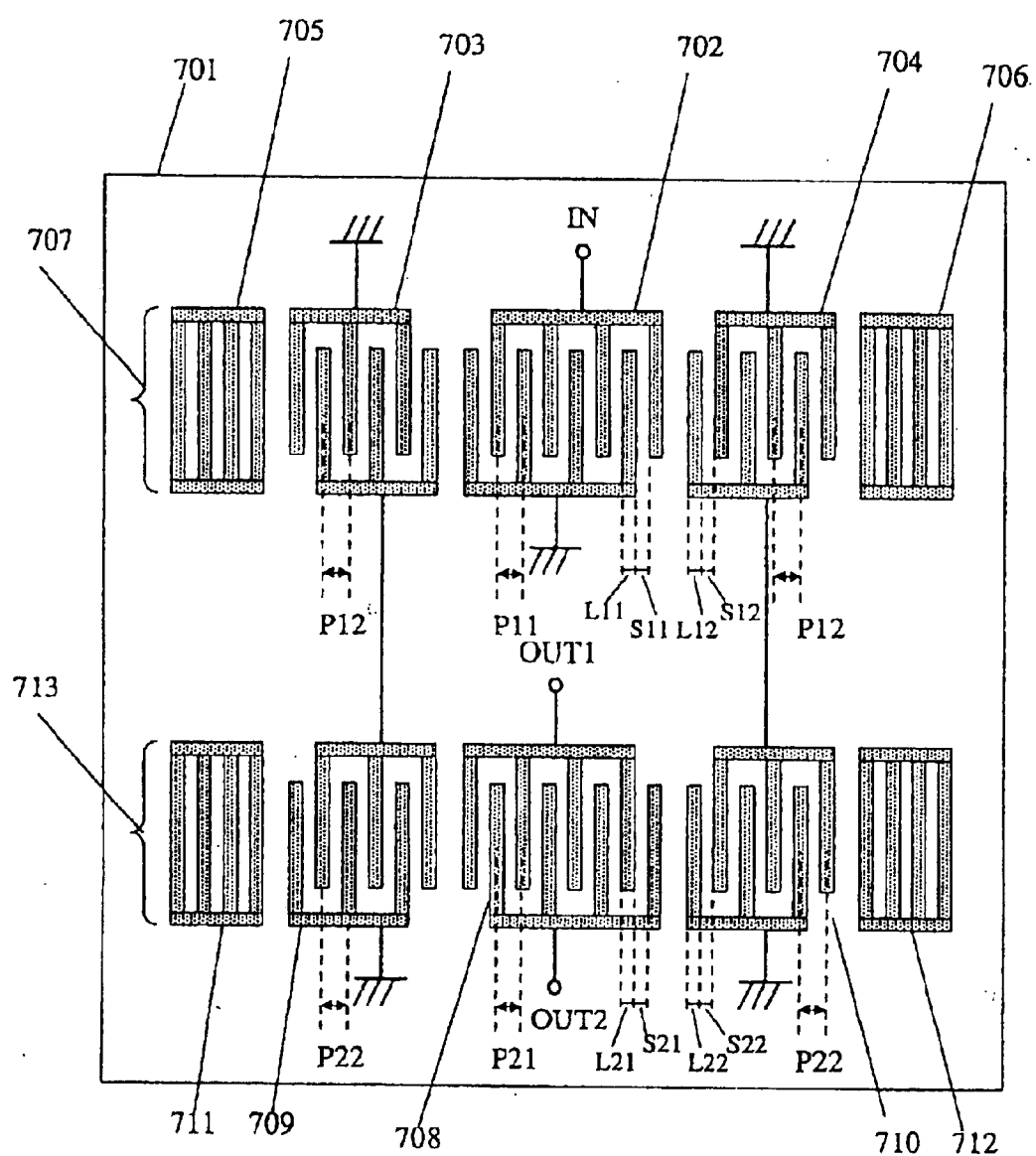
FIG. 7 is a diagram of a configuration of a surface acoustic wave filter in a fourth embodiment of the present invention.

FIG. 7 schematically shows a surface acoustic wave filter of this embodiment.

Referring to FIG. 7, a first filter track 707 is formed on a piezoelectric substrate 701 by first, second, and third IDT electrodes 702, 703, and 704 and first and second reflector electrodes 705 and 706. That is, the second IDT electrode 703 and the third IDT electrode 704 are placed on the both sides of the first IDT electrode 702. The reflector electrode 705 is placed on the side of these cond IDT electrode 703 opposite from the side on which the first IDT electrode 702 are placed. The reflector electrode 706 is placed on the side of the third IDT electrode 704 opposite from the side on which the first IDT electrode 702 are placed.

Also, a second filter track 713 is formed by fourth, fifth, and sixth IDT electrodes 708, 709, and 710, and first and second reflector electrodes 711 and 712. That is, the fifth IDT electrode 709 and the sixth IDT electrode 710 are placed on the both sides of the fourth of IDT electrode 708. The reflector electrode 711 is placed on the side of the fifth IDT electrode 709 opposite from the side on which the fourth IDT electrode 708 are placed. The reflector electrode 712 is placed on the side of the sixth IDT electrode 710 opposite from the side on which the fourth IDT electrode 708 are placed.

The upper electrode fingers of the first IDT electrodes 702 is connected to an input terminal IN. The lower electrode fingers of the IDT electrode 703 is connected to the upper electrode fingers of the fifth IDT electrode 709, and the lower electrode fingers of the third IDT electrode 704 is connected to the upper electrode fingers of the sixth IDT electrode 710. The upper electrode fingers of the fourth IDT electrode 708 is connected to an output terminal OUT1, while the lower electrode fingers of the fourth IDT electrode 708 is connected to another output terminal OUT2.

The number of electrode fingers of the first IDT electrode 702 is equal to that of the fourth IDT electrode 708. The second IDT electrode 703, the third IDT electrode 704, the fifth IDT electrode 709 and the sixth IDT electrode 710 have numbers of electrode fingers equal to each other.

The number of electrode fingers of each of the first and fourth IDT electrodes 702 and 708 is larger than that of each of the second, third, fifth, and sixth IDT electrodes 703, 704, 709, and 710. The pitch of the electrode fingers of the first IDT electrode 702 is represented by P11 and the pitch of the electrode fingers of the second and third IDT electrodes 703 and 704 is indicated by P12. The relationship between P11 and P12 is P11>P12. Also, the pitch of the electrode fingers of the fourth IDT electrode 708 is represented by P21 and the pitch of the electrode fingers of the fifth and sixth IDT electrodes 709 and 710 is indicated by P22. The relationship between P21 and P22 is P21>P22.

The metalization ratio η11 of the first IDT electrode 702 in the first filter track 707 is expressed by the following equation (2):

$$\eta 11 = L11/(L11+S11) \quad \text{[Equation 2]}$$

where L11 is the width of the electrode fingers of the first IDT electrode 702, and S11 is the spacing from one electrode finger to the next electrode finger in the first IDT electrodes 702.

The metalization ratio η12 of the second and third IDT electrodes 703 and 704 is expressed by the following equation (3):

$$\eta 12 = L12/(L12+S12) \quad \text{[Equation 3]}$$

where L12 is the width of the electrode fingers of the second and third IDT electrodes 703 and 704, and S12 is the spacing from one electrode finger to the next electrode finger in the second and third IDT electrodes 703 and 704.

The metalization ratio η21 of the fourth IDT electrode 708 in the second filter track 708 is expressed by the following equation (4):

$$\eta 21 = L21/(L21+S21) \quad \text{[Equation 4]}$$

where L21 is the width of the electrode fingers of the fourth IDT electrode 708, and S21 is the spacing from one electrode finger to the next electrode finger in the fourth IDT electrode 708.

The metalization ratio η22 of the fifth and sixth IDT electrodes 709 and 710 is expressed by the following equation (5):

$$\eta 22 = L22/(L22+S22) \quad \text{[Equation 5]}$$

where L22 is the width of the electrode fingers of the fifth and sixth IDT electrodes 709 and 710, and S22 is the spacing from one electrode finger to the next electrode finger in the fifth and sixth IDT electrodes 709 and 710.

In this embodiment, η11 and η12 shown above are different from each other, and η21 and η22 shown above are also different from each other.

The surface acoustic wave filter of this embodiment is thus constructed as a two-stage longitudinal-mode surface acoustic wave filter.

The operation of this embodiment will be described.

The center frequency fp of the radiation characteristic of the first IDT electrode 702 and the center frequency fp of the radiation characteristic of the second and third IDT electrodes 703 and 704 are set approximately equal to each other by establishing the relationship P11>P12 and by adjusting η11 and η12 to different values in accordance with the same method as that described above in detail in the description of the embodiments.

Also, the peak frequency fp of the radiation characteristic of the fourth IDT electrode 708 and the peak frequency fp of the radiation characteristic of the fifth and sixth IDT electrodes 709 and 710 are set approximately equal to each other by establishing the relationship P21>P22 and by adjusting η21 and η22 to different values.

Consequently, the surface acoustic wave filter of this embodiment can be realized as a wide-band surface acoustic wave filter having a steep attenuation characteristic, as are those in the above-described embodiments.

A wide-band surface acoustic wave filter having a steep attenuation characteristic can be realized by being arranged as described above.

This embodiment has been described with respect to the case where η11 and η12 are adjusted to different values while the relationship P11>P12 is established, and where η21 and η22 are adjusted to different values while the relationship P21>P22 is established. However, this adjustment method is not exclusively used. Adjustment using only the relationship P11>P21 and the relationship P21>P22 may alternatively be performed. Also, adjustment by changing only the metalization ratio while establishing P11=P12 and P21=P22 may be performed.

While the output terminals form a balanced output in this embodiment, the same effect of the present invention can also be achieved even if the upper or lower one of the fourth IDT electrode 708 may be grounded to form an unbalanced output.

Fifth Embodiment

A fifth embodiment of the present invention will be described.

Figure 10:
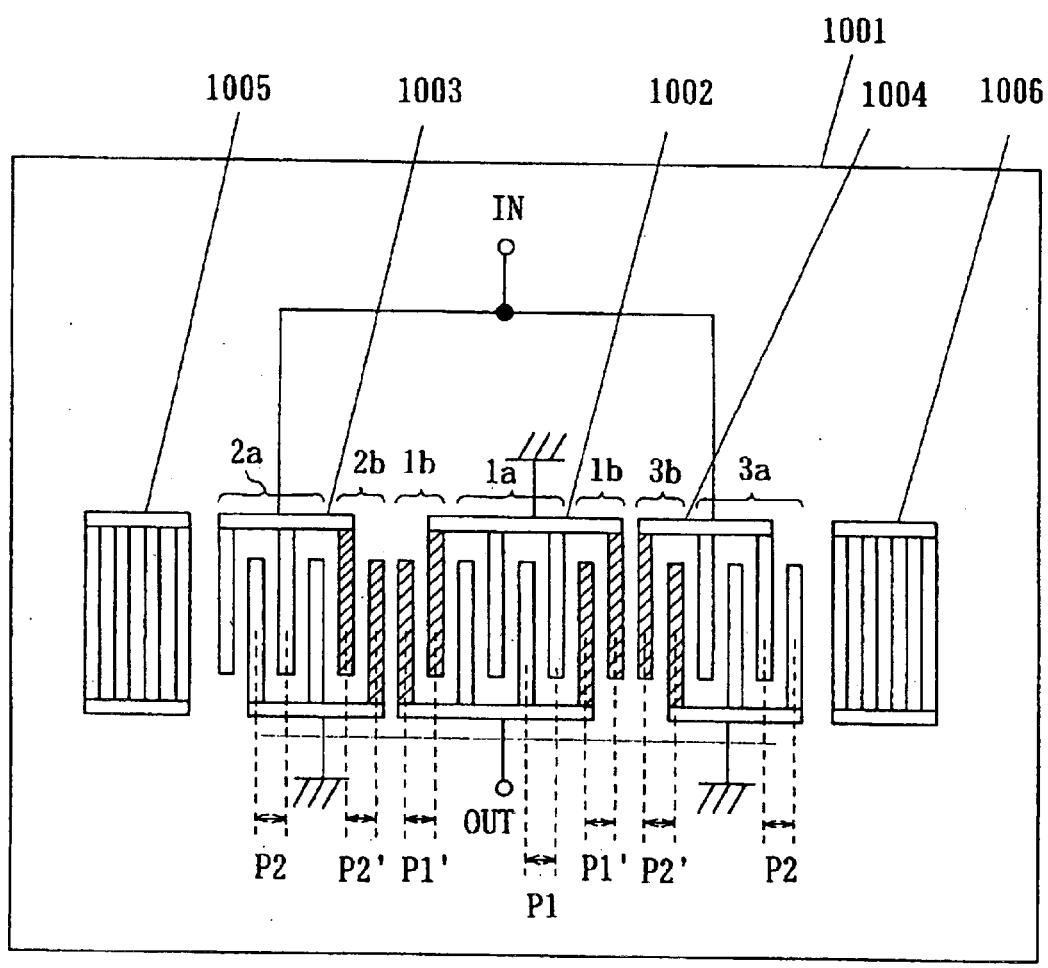
FIG. 10 is a diagram of a configuration of a surface acoustic wave filter in a fifth embodiment of the present invention.

FIG. 10 schematically shows a surface acoustic wave filter of this embodiment.

Referring to FIG. 10, the surface acoustic wave filter has a piezoelectric substrate 1001, first, second, and third IDT electrodes 1002, 1003, and 1004, and first and second reflector electrodes 1005 and 1006, the IDT electrodes and the reflector electrodes being formed on the substrate.

The second IDT electrode 1003 and the third IDT electrodes 1004 are placed on the opposite sides of the first IDT electrode 1002. The reflector electrode 1005 is placed on the side of the second IDT electrode 1003 opposite from the side on which the first IDT electrode 1002 are placed. The reflector electrode 1006 is placed on the side of the third IDT electrodes 1004 opposite from the side on which the first IDT electrode 1002 are placed. Thus, the first, second, and third IDT electrodes 1002, 1003, and 1004 and the first and second reflector electrodes 1005 and 1006 are arranged along the direction of propagation of a surface acoustic wave.

The upper electrode fingers of each of the second and third IDT electrodes 1003 and 1004 is connected to an input terminal IN, while the lower electrode fingers of each of the second and third IDT electrodes 1003 and 1004 is grounded. The lower electrode fingers of the first IDT electrode 1002 is connected to an output terminal OUT, while the upper electrode fingers of the first IDT electrode 1002 is grounded.

The number of electrode fingers of the first IDT electrode 1002 is larger than that of each of the second and third IDT electrodes 1003 and 1004, and the number of electrode fingers of the second IDT electrode 1003 and that of the third IDT electrode 1004 are equal to each other.

If the pitch in a region indicated by 1a in the first IDT electrode 1002 is P1, P1 is ½ wavelength. Also, if the pitch in a region indicated by 1b is P1', P1' is smaller than ½ wavelength. The number of electrode fingers in the region 1a having the pitch P is larger than the number of electrode fingers in the region 1b having the pitch P1'. In the first IDT electrode 1002, therefore, the region indicated by 1a is a main excitation region.

Also, if the pitch in a region indicated by 2a in the second IDT electrode 1003 is P2, P2 is ½ wavelength. Also, if the pitch in a region indicated by 2b is P2', P2' is smaller than ½ wavelength. The number of electrode fingers in the region 2a having the pitch P2 is larger than the number of electrode fingers in the region 2b having the pitch P2'. In the second IDT electrode 1003, therefore, the region indicated by 2a is a main excitation region.

The pitch in a region indicated by 3a in the third IDT electrode 1004 is P2, and P2 is ½wavelength. The pitch in a region indicated by 3b is P2', and P2' is smaller than ½wavelength. The number of electrode fingers in the region 3a having the pitch P2 is larger than the number of electrode fingers in the region 3b having the pitch P2'. In the third IDT electrode 1004, therefore, the region indicated by 3a is a main excitation region.

Thus, in each of the first IDT electrode 1002, the second IDT electrode 1003 and the third IDT electrode 1004, different electrode finger pitches are set between the electrode fingers of the same IDT electrode.

If the relationship between the pitch P1 and P2 satisfies P1>P2, the same effect as that of the first embodiment can be achieved.

In the case where the relationship between the pitch P1 and P2 satisfies P1>P2, the relationship between the pitch P1' and P2' may satisfy P1'>P2' or P1'=P2'. The discontinuity between the adjacent electrode fingers when P1'>P2' is satisfied can be smaller than that when P1'P2' is satisfied. The insertion loss can be relatively reduced by satisfying P1'>P2'.

While this embodiment has been described with respect to the case where P1>P2 is satisfied; the P1 and P2 may be adjusted so that the respective peak frequencies of radiation characteristics of the regions 1a, 2a, and 3a shown in FIG. 10 are set approximately equal to each other. It is desirable that the pitch P1, P1', P2, and P2' be adjusted so that the radiation characteristics of the first, second, and third IDT electrodes 1002, 1003, and 1004 coincide with each other. In such a case, equality between the pitches p2 and P2' of the second and third IDT electrodes 1003 and 1004 is not necessarily required.

To an arrangement in which the electrode fingers of one IDT electrode have different pitches as described above, each of the above-described embodiments may be applied on the basis of a setting of the pitches of the main excitation electrode fingers in the main excitation regions.

A wide-band surface acoustic wave filter having a steep attenuation characteristic can be realized by being arranged as described above.

While this embodiment has been described by assuming that the input terminal IN is of an unbalanced type, the input terminal IN is not limited to the unbalanced type. A balanced type of input terminal IN may alternatively be used.

While this embodiment has been described by assuming that the output terminal OUT is an unbalanced type, the output terminal OUT is not limited to the unbalanced type. A balanced type of output terminal OUT may alternatively be used.

This embodiment has been described with respect to the case where the second and third IDT electrodes 1003 and 1004 is connected to the input terminal IN while the first IDT electrode 1002 is connected to the output terminal OUT. However, the arrangement may alternatively be such the second and third IDT electrodes 1003 and 1004 is connected to the output terminal OUT while the first IDT electrode 1002 is connected to the input terminal IN.

Sixth Embodiment

A sixth embodiment of the present invention will be described

Figure 11:
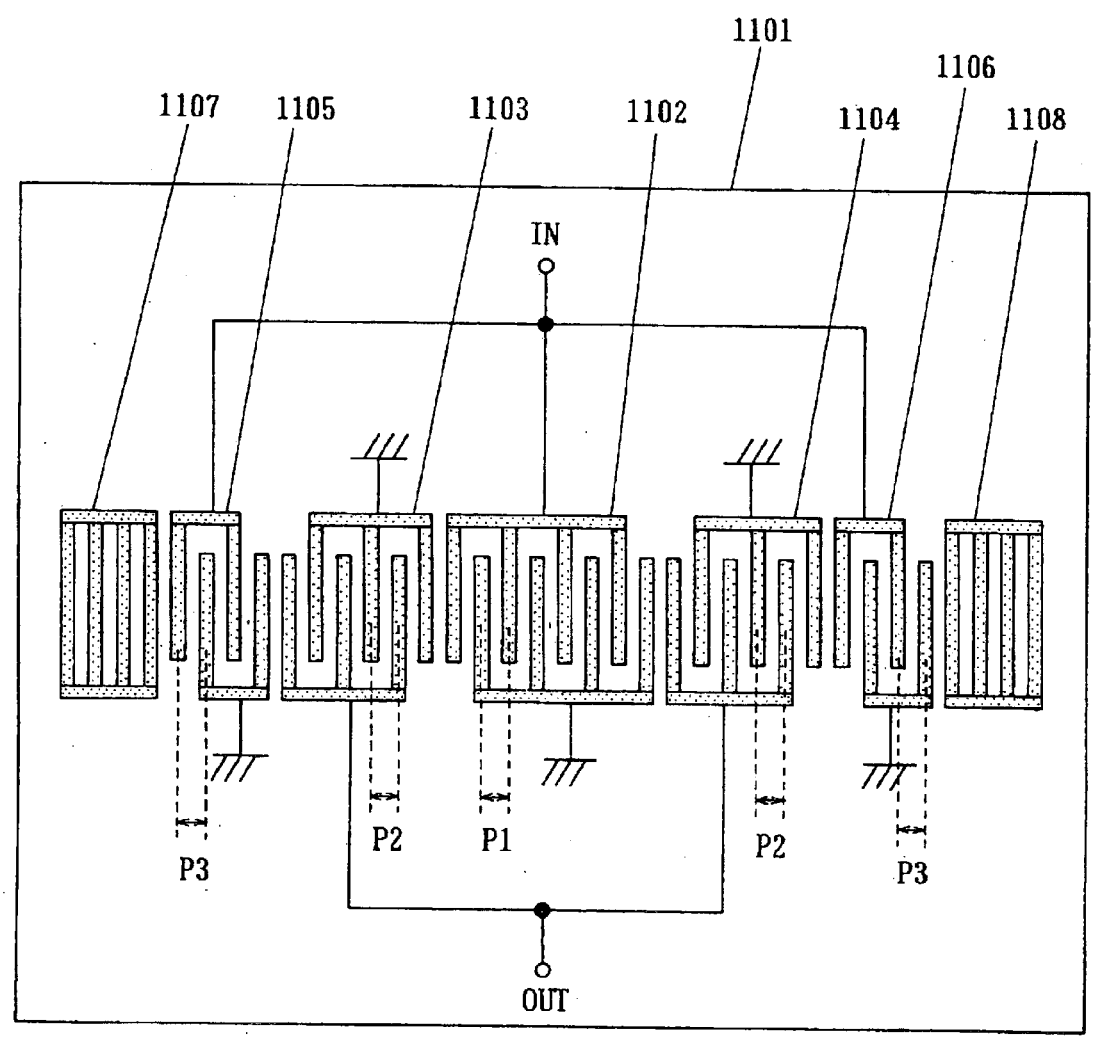
FIG. 11 is a diagram of a configuration of a surface acoustic wave filter in a sixth embodiment of the present invention.
Figure 12:
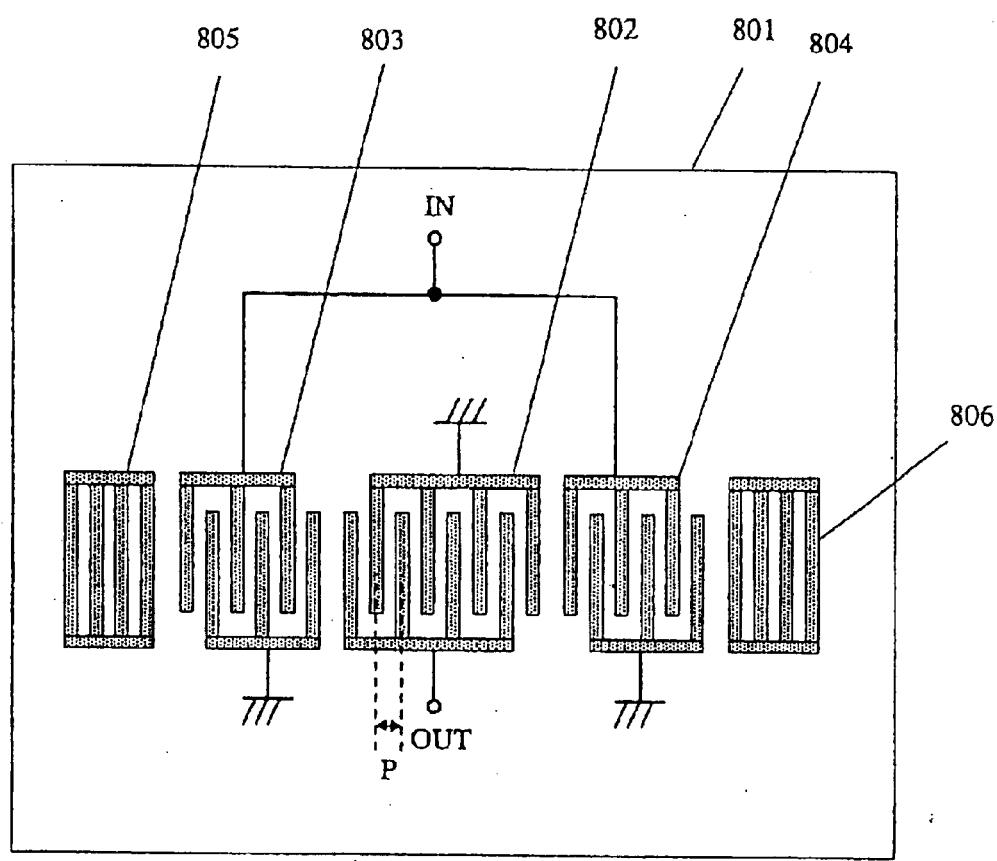
FIG. 12 is a diagram of a configuration of a conventional surface acoustic wave filter.
Figure 13:
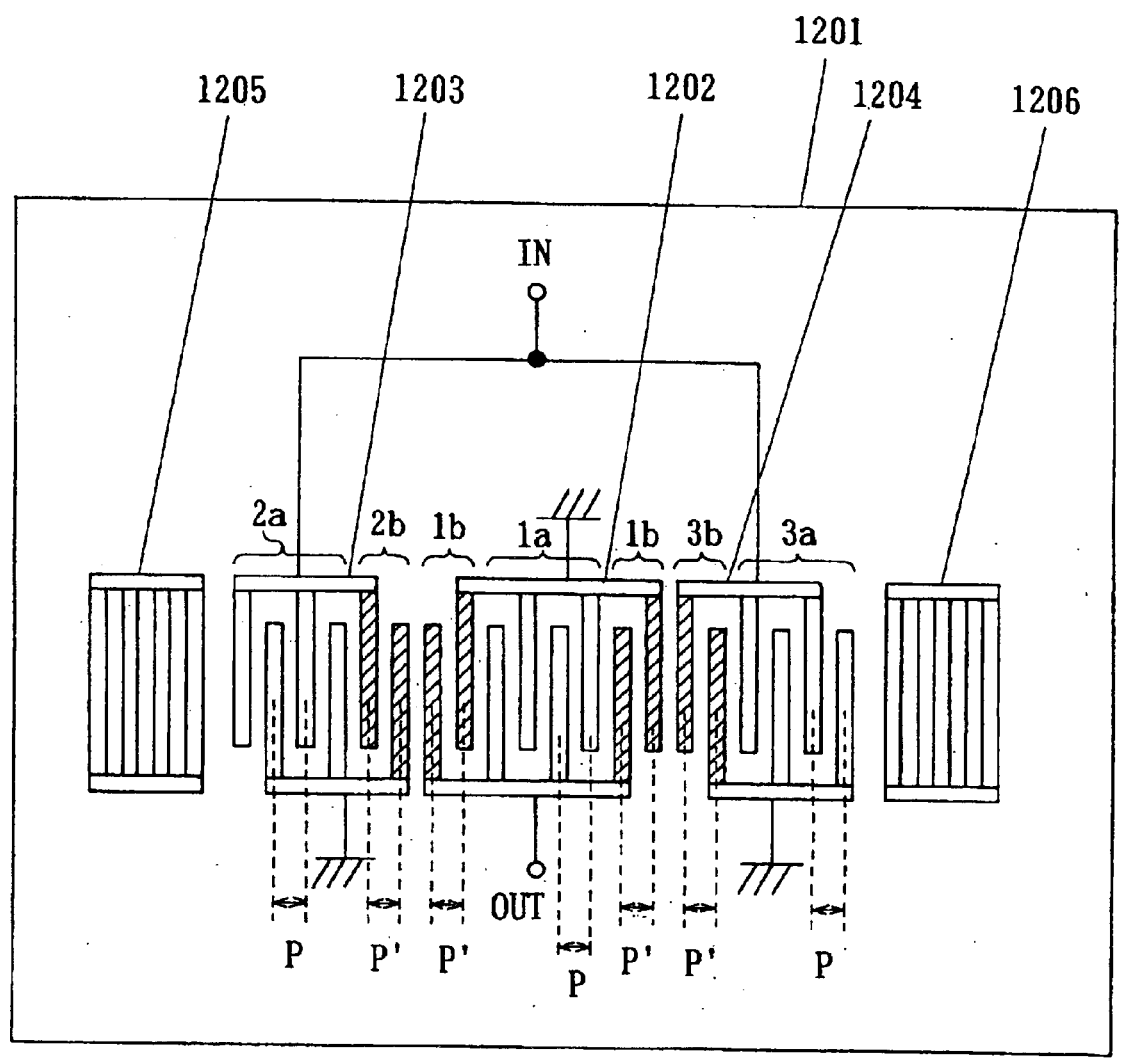
FIG. 13 is a diagram of a configuration of another conventional surface acoustic wave filter.

FIG. 11 schematically shows a surface acoustic wave filter of this embodiment.

Referring to FIG. 11, the surface acoustic wave filter has a piezoelectric substrate 101, first, second, third, fourth, and fifth IDT electrodes 1102, 1103, 1104, 1105, and 1106, and first and second reflector electrodes 1107 and 1108, the IDT electrodes and the reflector electrodes being formed on the substrate.

The second IDT electrode 1103 and the third IDT electrode 1104 are placed on the both sides of the first IDT electrode 1102. The fifth IDT electrode 1106 are placed on the side of the third IDT electrode 1104 opposite from the side on which the first IDT electrode 1102 are placed. The fourth IDT electrode 1105 are placed on the side of the second IDT electrode 1103 opposite from the side on which the first IDT electrode 1102 are placed. The first reflector electrode 1107 is placed outside the fourth IDT electrode 1105, and the second reflector electrode 1108 is placed outside the fifth IDT electrode 1106.

Thus, the first, second, third, fourth, and fifth IDT electrodes 1102, 1103, 1104, 1105, and 1106 and the first and second reflector electrodes 1107 and 1108 are arranged along the direction of propagation of a surface acoustic wave.

The lower electrode fingers of each of the second and third IDT electrodes 1103 and 1104 is connected to an output terminal OUT, while the upper electrode fingers of each of the second and third IDT electrodes 1103 and 1104 is grounded. The upper electrode fingers of each of the first, fourth, and fifth IDT electrodes 1102, 1105, and 1106 is connected to an input terminal IN, while the lower electrode fingers of each of the first, fourth, and fifth IDT electrodes 1102, 1105, and 1106 is grounded.

The number of electrode fingers of the first IDT electrode 1102 is larger than that of each of the second and third IDT electrodes 1103 and 1104, and the number of electrode fingers of the second IDT electrode 1103 and that of the third IDT electrode 1104 are equal to each other. Also, the number of electrode fingers of each of the fourth and fifth IDT electrodes 1105 and 1106 is smaller than that of each of the second and third IDT electrodes 1103 and 1104, and the number of electrode fingers of the fourth IDT electrode 1105 and that of the fifth IDT electrode 1106 are equal to each other.

If the pitch of the electrode fingers of the first of IDT electrode 1102 is P1; the pitch of the electrode fingers of the second and third IDT electrodes 1103 and 1104 is P2; and the pitch of the electrode fingers of the fourth and fifth IDT electrodes 1105 and 1106 is P3, the pitches P1 to P3 are in the relationship P1>P2>P3. That is, the pitch of one group of electrode fingers larger in number in the groups of electrode fingers of the IDT electrodes constituting the surface acoustic wave filter of this embodiment is larger than the pitch of another group of electrode fingers smaller in number.

The first, second, third, fourth, and fifth IDT electrodes 1102, 1103, 1104, 1105, and 1106 have metalization ratios η equal to each other. The metalization ratio η represents the proportion of the width of the electrode finger in one wavelength.

The metalization ratio η is expressed by the equation (1) shown above in the description of the first embodiment.

The operation of this embodiment will be described.

If the number of electrode fingers of the first IDT electrode 1102 is increased, the center frequency of the radiation characteristic of the first IDT electrode 1102 is higher, as described above in the description of the first embodiment. Also, if the metalization ratio η of the first IDT electrode 1102 is increased, the center frequency of the radiation characteristic of the first IDT electrode 1102 is lower. Thus, the center frequency of the radiation characteristic of the first IDT electrode 1102 becomes higher if the number of electrode fingers is increased or if the metalization ratio η is reduced while the electrode film thickness of the first IDT electrode 1102 is constant. With respect to the second, third, fourth, and fifth IDT electrodes 1103, 1104, 1105, and 1106, the same tendency as that observed with respect to the first IDT electrode 1102 is recognized.

Since the pitch P1 of the electrode fingers of the first IDT electrode 1102, the pitch P2 of the electrode fingers of each of the second and third IDT electrodes 1103 and 1104, and the pitch P3 of the electrode fingers of each of the fourth and fifth IDT electrodes 1105 and 1106 are in the relationship P1>P2>P3, the center frequencies of radiation characteristics of the first, second, third, fourth, and fifth IDT electrodes 1102, 1103, 1104, 1105, and 1106 can be set approximately equal to each other.

That is, if the center frequencies of the radiation characteristics of the first, second, third, fourth, and fifth IDT electrodes 1102, 1103, 1104, 1105, and 1106 are equal to each other, the surface acoustic wave filter of this embodiment has an attenuation characteristic of a wider band.

The surface acoustic wave filter is thus arranged to be realized as a wide-band filter having a steep attenuation characteristic.

While this embodiment has been described by assuming that the input terminal IN is of an unbalanced type, the input terminal IN is not limited to the unbalanced type. A balanced type of input terminal IN may alternatively be used.

While this embodiment has been described by assuming that the output terminal OUT is an unbalanced type, the output terminal OUT is not limited to the unbalanced type. A balanced type of output terminal OUT may alternatively be used.

The relationship between the numbers of electrode fingers of the first to fifth IDT electrodes is not limited to that described above. The relationship is optimized according to filter characteristics.

This embodiment has been described with respect to the case where the second and third IDT electrodes 1103 and 1104 is connected to the output terminal OUT while the first, fourth, and fifth IDT electrodes 1102, 1105, and 1106 is connected to the input terminal IN. However, the arrangement may alternatively be such that the second and third IDT electrodes 1103 and 1104 is connected to the input terminal IN while the first, fourth, and fifth IDT electrodes 1102, 1105, and 1106 is connected to the output terminal OUT.

This embodiment has been described with respect to the case where the pitch of the electrode fingers of each IDT electrodes is adjusted and the case where the electrode finger pitch and the metalization ratio of each IDT electrodes are adjusted. However, the present invention is not limited to the described adjustment methods. The center frequencies of the radiation characteristics of the IDT electrodes can be set approximately equal to each other in a different manner as described below.

It is known that the peak frequency of the radiation characteristic of each IDT electrodes becomes lower if the film thickness of the IDT electrodes is increased. Therefore it is possible to adjust the peak frequencies of the radiation characteristics of the IDT electrodes to the desired frequency by setting the film thickness of the first IDT electrode and the film thickness of the second and third IDT electrodes to different values.

It is also known that the peak frequency of the radiation characteristic of each IDT electrodes is changed if the material of the IDT electrodes is changed. Therefore it is possible to adjust the peak frequencies of the radiation characteristics of the IDT electrodes to the desired frequency by using different materials for the first IDT electrode and the second and third IDT electrodes.

It is also known that the peak frequency of the radiation characteristic of each IDT electrodes becomes lower if the metalization ratio of the IDT electrodes is increased. Therefore it is possible to adjust the peak frequencies of the radiation characteristics of the IDT electrodes to the desired frequency by setting the metalization ratio of the first IDT electrode and the metalization of the second and third IDT electrodes to different values.

It is also possible to adjust the center frequencies of the radiation characteristics of the IDT electrode to the desired frequency by freely combining the above-described methods.

Each of the first to fourth embodiments has been described by assuming that the second and third IDT electrodes have numbers of electrode fingers equal to each other. However, the present invention is not limited to this arrangement. Even in a case where the second and third IDT electrodes have different numbers of electrode fingers, the same effect as that of the first to fourth embodiments can also be achieved if the electrode finger pitches are adjusted so that the peak frequencies of the radiation characteristics are equal to each other.

A communication device using the surface acoustic wave filter of the present invention in a portion of a transmitting circuit or receiving circuit also belongs to the present invention. Examples of such a communication device are a portable telephone terminal, a base station for portable telephone terminals, a motor vehicle telephone terminal, a terminal in a Personal Handyphone System, and a radar device.

A method of manufacturing a surface acoustic wave filter having a piezoelectric substrate, IDT electrodes for input, arranged on the piezoelectric substrate, and IDT electrodes for output, arranged on the piezoelectric substrate, in which the peak frequency of the radiation characteristic of the input IDT electrodes and the peak frequency of the radiation characteristic of the output IDT electrodes are set substantially equal to each other also belongs to the present invention.

A method of manufacturing a surface acoustic wave filter having a piezoelectric substrate, IDT electrodes for input, arranged on the piezoelectric substrate, and IDT electrodes for output, arranged on the piezoelectric substrate, in which the pitch of the electrode fingers of the input IDT electrodes and the pitch of the electrode fingers of the output IDT electrodes are set different from each other also belongs to the present invention.

The output IDT electrodes of the present invention are not limited to the first IDT electrode of the surface acoustic wave filter in the embodiment described above with reference to FIG. 1 or 6, or to the fourth, fifth, and sixth IDT electrodes of the surface acoustic wave filter described above with reference to FIG. 3 or 7. Also, the input IDT electrodes of the present invention are not limited to the second and third IDT electrodes of the surface acoustic wave filter in the embodiment described above with reference to FIG. 1 or 6, or to the first, second, and third IDT electrodes of the surface acoustic wave filter described above with reference to FIG. 3 or 7.

The embodiments of the present invention have been described with respect to the arrangement in which three IDT electrodes are formed as input and output IDT electrodes, and the arrangement in which five IDT electrodes are formed as input and output IDT electrodes. However, the present invention is not limited to these arrangements. Two IDT electrodes, four IDT electrodes or seven or more IDT electrodes may be formed as input and output IDT electrodes.

This embodiment has been described by assuming that the number of electrode fingers of the second IDT electrodes and that of the third IDT electrode are equal to each other, and that the number of electrode fingers of the fourth IDT electrode and that of the fifth IDT electrodes are equal to each other. However, if these numbers are different, the IDT electrodes may be adjusted so that their radiation characteristics coincide with each other.

As is apparent from foregoing, the present invention makes it possible to provided a surface acoustic wave filter of a wider band having a steep out-of-band attenuation characteristic, a method manufacturing the surface acoustic wave filter, and a communication device using the surface acoustic wave filter.

What is claimed is:

1. A surface acoustic wave filter comprising:
   a piezoelectric substrate;
   at least an input IDT electrode arranged on said piezoelectric substrate; and
   at least an output IDT electrode arranged on said piezoelectric substrate,
   wherein said surface acoustic wave filter is a longitudinally coupled mode surface acoustic filter and includes said input IDT electrode and said output IDT electrode disposed within a single propagation path in which a surface acoustic wave propagates,
   said input IDT electrode has a plurality of electrode fingers pitches;
   of the electrode fingers pitches of said input IDT electrode, an electrode fingers pitch having the most pairs of electrode fingers is defined as a main input pitch,
   said output IDT electrode has a plurality of electrode fingers pitches,
   of the electrode fingers pitches of said output IDT electrode, an electrode fingers pitch having the most pairs of electrode fingers is defined as a main output pitch,
   the main input pitch of electrode fingers of said input IDT electrode and the main output pitch of electrode fingers of said output IDT electrode are different from each other,
   the main pitch of electrode fingers of the IDT electrode larger in number of electrode fingers in said input and output IDT electrode is larger than the main pitch of electrode fingers smaller in number of electrode fingers, and
   one of said input IDT electrode and said output IDT electrode comprises first IDT electrode each including a pair of electrode fingers opposed to each other;
   the other of said input IDT electrode and said output IDT electrode comprises second and third IDT electrodes each including a pair of electrode fingers opposed to each other;
   said second IDT electrode is placed on one side of said first IDT electrode;
   said third IDT electrode is placed on the other side of said first IDT electrode;
   said first, second, and third IDT electrodes are arranged along a direction in which a surface acoustic wave propagates; and
   the peak frequency of the radiation characteristic of said first IDT electrode and at least one of said second and third IDT electrode are substantially equal to each other.

2. The surface acoustic wave filter according to claim 1, wherein a fourth IDT electrode is placed on the side of said second IDT electrode opposite from the side on which said first IDT electrode is placed; and
   a fifth IDT electrode is placed on the side of said third IDT electrode opposite from the side on which said first IDT electrode is placed.

3. A surface acoustic wave filter comprising:
   a piezoelectric substrate;
   at least an input IDT electrode arranged on said piezoelectric substrate; and
   at least an output IDT electrode arranged on said plezoelectric substrate,
   wherein said surface acoustic wave filter is a longitudinally coupled mode surface acoustic filter and includes said output IDT electrode and said output IDT electrode disposed within a single propagation path in which a surface acoustic wave propagates,
   said input IDT electrode has a plurality of electrode fingers pitches;
   of the electrode fingers pitches of said input IDT electrode, an electrode fingers pitch having the most pairs of electrode fingers is defined as a main input pitch,
   said output IDT electrode has a plurality of electrode fingers pitches,
   of the electrode fingers pitches of said output IDT electrode, an electrode fingers pitch having the most pairs of electrode fingers is defined as a main output pitch,
   the main input pitch of electrode fingers of said input IDT electrode and the main output pitch of electrode fingers of said output IDT electrode are different from each other,
   the main pitch of electrode fingers of the IDT electrode larger in number of electrode fingers in said input and output IDT electrode is larger than the main pitch of electrode fingers smaller in number of electrode fingers, and
   one of said input IDT electrode and said output IDT electrode comprises first, fourth, and fifth IDT electrodes each including a pair of electrode fingers opposed to each other;
   the other of said input IDT electrode and said output IDT electrode comprises second and third IDT electrodes each including a pair of electrode fingers opposed to each other;
   said second and third IDT electrodes are placed on opposite sides of said first IDT electrode;
   said fourth IDT electrode is placed on the side of said second IDT electrode opposite from the side on which said first IDT electrode is placed;
   said fifth IDT electrode is placed on the side of said third IDT electrode opposite from the side on which said first IDT electrode is placed;
   said first, second, third, fourth, and fifth IDT electrodes are arranged along a direction in which a surface acoustic wave propagates; and the peak frequencies of the radiation characteristics of at least one of said fourth and fifth IDT electrodes, and at least one of said second and third IDT electrodes are substantially equal to each other.

4. A surface acoustic wave filter comprising:
a plezoelectric substrate;
at least an input IDT electrode arranged on said piezoelectric substrate; and
at least an output IDT electrode arranged on said piezoelectric substrate,
wherein said surface acoustic wave filter is a longitudinally coupled mode surface acoustic filter and includes said input IDT electrode and said output IDT electrode disposed within a single propagation path in which a surface acoustic wave propagates,
said input IDT electrode has a plurality of electrode fingers pitches;
of the electrode fingers pitches of said input IDT electrode, an electrode fingers pitch having the most pairs of electrode fingers is defined as a main input pitch,
said output IDT electrode has a plurality of electrode fingers pitches,
of the electrode fingers pitches of said output IDT electrode, an electrode fingers pitch having the most pairs of electrode fingers is defined as a main output pitch,
the main input pitch of electrode fingers of said input IDT electrode and the main output pitch of electrode fingers of said output IDT electrode are different from each other,
the main pitch of electrode fingers of the IDT electrode larger in number of electrode fingers in said input and output IDT electrode is larger than the main pitch of electrode fingers smaller in number of electrode fingers,
wherein said input IDT electrode has electrode fingers spaced to define first and second electrode fingers pitches;
the first electrode fingers pitch is the main input pitch of said input IDT electrode,
said output IDT electrode has electrode fingers spaced to define third and fourth pitches,
the third electrode fingers pitch is the main output pitch of said output IDT electrode,
a peak frequency of a radiation characteristic of said input IDT electrode is substantially equal to a peak frequency of a radiation characteristic of said output IDT electrode,
one of said input IDT electrode and said output IDT electrode comprises first, fourth, and fifth IDT electrodes each including a pair of electrode fingers opposed to each other;
the other of said input IDT electrode and said output IDT electrode comprises second and third IDT electrodes each including a pair of electrode fingers opposed to each other;
said second and third IDT electrodes are placed on opposite sides of said first IDT electrode;
said fourth IDT electrode is placed on the side of said second IDT electrode opposite from the side on which said first IDT electrode is placed;
said fifth IDT electrode is placed on the side of said third IDT electrode opposite from the side an which said first IDT electrode is placed;

said first, second, third, forth and fifth IDT electrodes are arranged along a direction in which a surface acoustic wave propagates; and
the peak frequencies of the radiation characteristics of the group of said first IDT electrode, and the group of said second and third IDT electrodes are substantially equal to each other.

5. A surface acoustic wave filter comprising:
a piezoelectric substrate;
at least an input IDT electrode arranged on said piezoelectric substrate; and
at least an output IDT electrode arranged on said piezoelectric substrate,
wherein said surface acoustic wave filter is a longitudinally coupled mode surface acoustic filter and includes said input IDT electrode and said output IDT electrode disposed within a single propagation path in which a surface acoustic wave propagates,
said input IDT electrode has a plurality of electrode fingers pitches;
of the electrode fingers pitches of said input IDT electrode, an electrode fingers pitch having the most pairs of electrode fingers is defined as a main input pitch,
said output IDT electrode has a plurality of electrode fingers pitches,
of the electrode fingers pitches of said output IDT electrode, an electrode fingers pitch having the most pairs of electrode fingers is defined as a main output pitch,
the main input pitch of electrode fingers of said input IDT electrode and the main output pitch of electrode fingers of said output IDT electrode are different from each other,
the main pitch of electrode fingers of the IDT electrode larger in number of electrode fingers in said input and output IDT electrode is larger than the main pitch of electrode fingers smaller in number of electrode fingers,
wherein said input IDT electrode has electrode fingers spaced to define first and second electrode fingers pitches;
the first electrode fingers pitch is the main input pitch of said input IDT electrode,
said output IDT electrode has electrode fingers spaced to define third and fourth pitches,
the third electrode fingers pitch is the main output pitch of said output IDT electrode,
a peak frequency of a radiation characteristic of said input IDT electrode is substantially equal to a peak frequency of a radiation characteristic of said output IDT electrode,
one of said input IDT electrode and said output IDT electrode comprises first, fourth, and fifth IDT electrodes each including a pair of electrode fingers opposed to each other;
the other of said Input IDT electrode and said output IDT electrode comprises second and third IDT electrodes each including a pair of electrode fingers opposed to each other;
said second and third IDT electrodes are placed on opposite sides of said first IDT electrode;
said fourth IDT electrode is placed on the side of said second IDT electrode opposite from the side on which said first IDT electrode is placed;

said fifth IDT electrode is placed on the side of said third IDT electrode opposite from the side on which said first IDT electrode is placed;

said first, second, third, forth and fifth IDT electrodes are arranged along a direction in which a surface acoustic wave propagates; and the peak frequencies of the radiation characteristics of the group of said fourth and fifth IDT electrodes, and the group of said second and third IDT electrodes are substantially equal to each other.

* * * * *

UNITED STATES PATENT AND TRADEMARK OFFICE
CERTIFICATE OF CORRECTION

PATENT NO. : 6,853,269 B2
DATED : February 8, 2005
INVENTOR(S) : Hiroyuki Nakamura et al.

It is certified that error appears in the above-identified patent and that said Letters Patent is hereby corrected as shown below:

Title page,
Item [57], ABSTRACT,
Line 4, please delete "plezoelectric" and substitute therefore -- piezoelectric --.

Column 21,
Line 6, delete "plezoelectric" and insert -- piezoelectric --.

Signed and Sealed this

Twelfth Day of July, 2005

JON W. DUDAS
*Director of the United States Patent and Trademark Office*